US012620987B2

(12) United States Patent
Serra

(10) Patent No.: US 12,620,987 B2
(45) Date of Patent: May 5, 2026

(54) CURRENT GATE DRIVER FOR WIDE BANDGAP SEMICONDUCTOR TRANSISTOR

(71) Applicant: Monolithic Power Systems, Inc., Kirkland, WA (US)

(72) Inventor: Abel Borras Serra, Barcelona (ES)

(73) Assignee: Monolithic Power Systems, Inc., Kirkland, WA (US)

( * ) Notice: Subject to any disclaimer, the term of this patent is extended or adjusted under 35 U.S.C. 154(b) by 108 days.

(21) Appl. No.: 18/543,774

(22) Filed: Dec. 18, 2023

(65) Prior Publication Data

US 2025/0202478 A1      Jun. 19, 2025

(51) Int. Cl.
H03K 17/687          (2006.01)
H03K 17/567          (2006.01)

(52) U.S. Cl.
CPC ......... H03K 17/687 (2013.01); H03K 17/567 (2013.01)

(58) Field of Classification Search
CPC ............... H03K 17/687; H03K 17/567; H03K 2017/6875; H03K 17/56; H03K 17/04106; H03K 17/041; H03K 17/0412; H03K 17/0416; H03K 17/04163; H03K 17/042; H03K 17/04206; H03K 17/08; H03K 17/082; H03K 17/0822; H03K 17/18; H03K 17/081; H03K 17/08104; H03K 17/0812; H03K 17/0814; H03K 17/08122; H03K 17/08142; H03K 17/163; H03K 17/161; H03K 17/16; H03K 17/162; H03K 17/164; H03K 17/165; H03K 17/166; H03K 17/167; H03K 17/28; H03K 17/284; H03K 17/30; H03K 17/302
See application file for complete search history.

(56) References Cited

U.S. PATENT DOCUMENTS 8,633,755 B2 *    1/2014  Kawamoto .......... H03K 17/163
327/434

OTHER PUBLICATIONS

Dr. Bainan Sun, "Quick-reference guide to driving CoolGaN™ GIT HEMTs 600 V", Infineon Application Note AN_2107_PL52_2108_ 14142727. V1.1, Dec. 2, 2021, 12 pages. www.infineon.com/hemt.
Infineon, "Gate drive solutions for CoolGaN™ GIT HEMTs", White Paper Nov. 2021, 24 pages. www.infineon.com/dgdl/Infineon-Gallium_nitride_Gate_drive_solutions_for_CoolGaN_600V_HEMTs-Whitepaper-v01_00-EN.pdf?fileId= 5546d462766cbe86017684b68afc5360&da=t.
Panasonic, "Single-Channel GaN—Tr High-Speed Gate Driver", AN34092B, Doc. No. TD4-ZZ-00049 Revision 1, Jan. 13, 2017, 17 pages. www.mouser.com/datasheet/2/315/FLY000070_EN-1218957.

* cited by examiner

*Primary Examiner* — Jung Kim
(74) *Attorney, Agent, or Firm* — Perkins Coie LLP

(57)          ABSTRACT

A gate driver has a turn-on circuit and a turn-off circuit. The turn-on circuit pulls up a gate terminal of a wide bandgap (WBG) semiconductor transistor and turns on the WBG semiconductor transistor in response to a first status of an on-off control signal. The turn-off circuit pulls down the gate terminal of the WBG semiconductor transistor and turns off the WBG semiconductor transistor in response to a second status of the on-off control signal. When the on-off control signal transits to the first status, the turn-on circuit drives the gate terminal of the WBG semiconductor transistor at a first constant driving current, and later switches to a second constant driving current. The second constant driving current is lower than the first constant driving current.

20 Claims, 7 Drawing Sheets

700

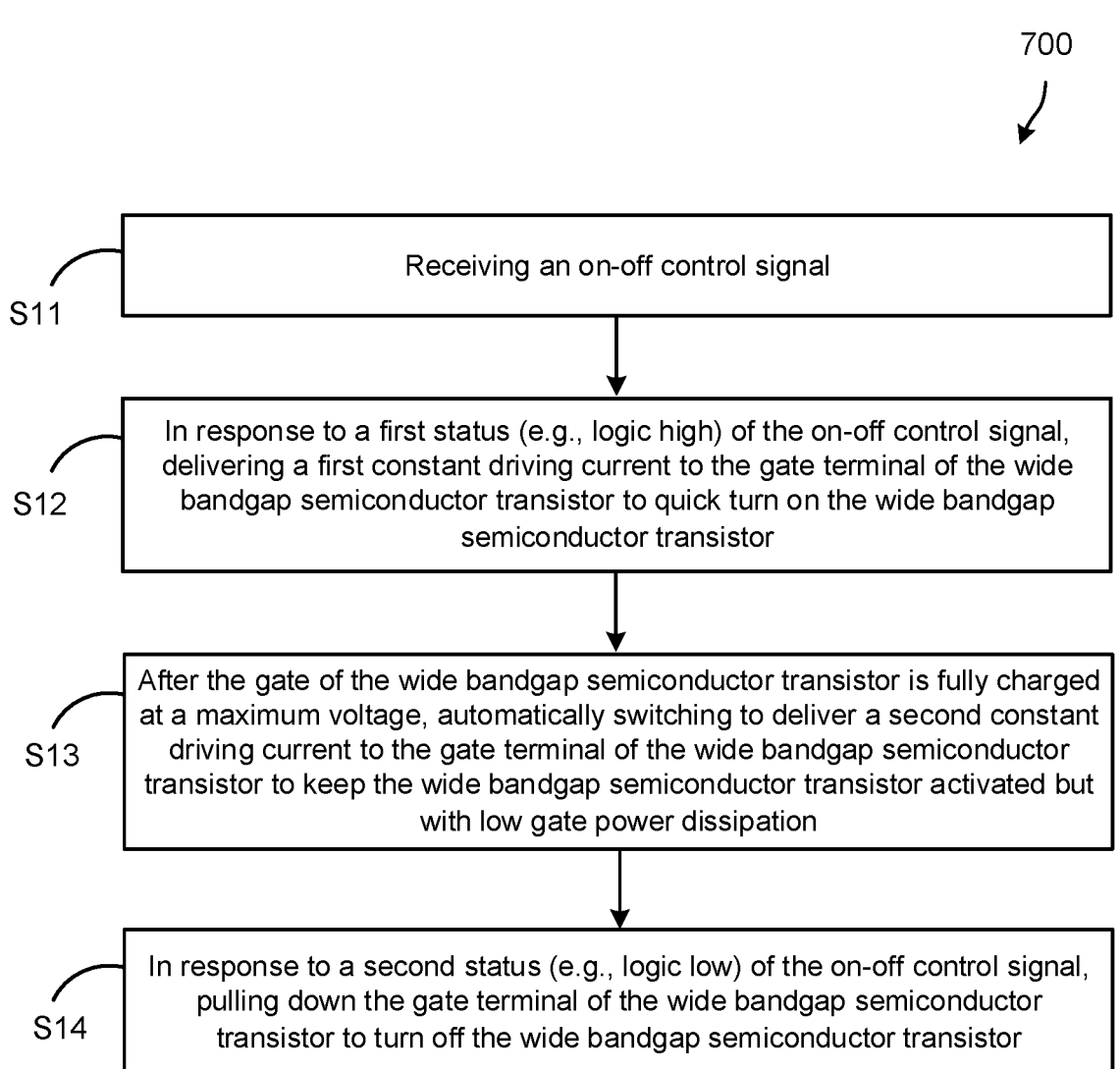

S11 — Receiving an on-off control signal

S12 — In response to a first status (e.g., logic high) of the on-off control signal, delivering a first constant driving current to the gate terminal of the wide bandgap semiconductor transistor to quick turn on the wide bandgap semiconductor transistor S13 — After the gate of the wide bandgap semiconductor transistor is fully charged at a maximum voltage, automatically switching to deliver a second constant driving current to the gate terminal of the wide bandgap semiconductor transistor to keep the wide bandgap semiconductor transistor activated but with low gate power dissipation S14 — In response to a second status (e.g., logic low) of the on-off control signal, pulling down the gate terminal of the wide bandgap semiconductor transistor to turn off the wide bandgap semiconductor transistor

FIG. 7

CURRENT GATE DRIVER FOR WIDE BANDGAP SEMICONDUCTOR TRANSISTOR

BACKGROUND OF THE INVENTION

1. Field of the Invention

The present invention generally relates to electronic circuit, and more particularly but not exclusively relates to current gate driver for wide bandgap semiconductor transistor.

2. Description of Related Art

Usually, conductivity between a drain terminal and a source terminal of a silicon power field effect transistor (FET) is controlled by a voltage applied between a gate terminal and the source terminal of the FET. The FET may be driven by a voltage gate driver that perform either as a voltage source to turn-on the FET or voltage sink to turn-off the FET. When driven, the gate terminal of the FET absorbs and releases electric charge in a way that could be modelled as a capacitor.

Wide bandgap materials, such as gallium nitride (GaN), allows to create faster normally-off FET transistors when using several epitaxial architectures or combinations. GaN high electron mobility transistors (HEMTs) can be found in different architectures, such as HEMTs in a cascode configuration with a Si metal-oxide semiconductor field effect transistor (MOSFET), enhancement mode HEMTs, gate injection transistor (GIT), and so on. For HEMTs in a cascode configuration with a Si MOSFET, the gate behaves as a Silicon MOSFET which can be easily derived, but the overall transistor exhibits higher RONxQG and RONxEOSS than other configurations. Enhancement mode HEMTs exhibit better Figures of Merit (FOMs). However, Gate leakage current is injected to the semiconductor when the Gate voltage is higher than the equivalent diode forward voltage (VF) between the Gate and the channel. This Gate current injection is responsible of the current collapse phenomena which brings to a threshold voltage Vth shift and an on-resistance Ron degradation. GITs solve the problem of current collapse through hole injection. The gate of a GIT has an ohmic behavior, which is very rugged against overvoltage, due to the self-clamping nature of the equivalent diode between the gate and channel, but draws an excessive current which makes it difficult to drive. Thus, both the enhancement mode HEMTs and GITs require a different driver design.

SUMMARY OF THE INVENTION

It is one of the objects of the present invention to provide a current gate driver for wide bandgap semiconductor transistor.

One embodiment of the present invention discloses a current gate driver for a wide bandgap (WBG) semiconductor transistor, comprising an input terminal, an output terminal, a turn-on circuit, and a turn-off circuit. The input terminal is configured to receive an on-off control signal. The output terminal is coupled to a gate terminal of the WBG semiconductor transistor. The turn-on circuit is coupled to the output terminal, to drive the WBG semiconductor transistor by providing a gate current flowing into the gate terminal of the WBG semiconductor transistor via the output terminal in response to a first status of the on-off control signal. The turn-off circuit is coupled to the output terminal, to pull down the gate terminal of the WBG semiconductor transistor and turn off the WBG semiconductor transistor in response to a second status of the on-off control signal. When the on-off control signal transits to the first status, the turn-on circuit is configured to drive the gate terminal of the WBG semiconductor transistor at a first constant driving current first, and later switch to a second constant driving current to drive the gate terminal of the WBG semiconductor transistor, and the second constant driving current is lower than the first constant driving current.

Another embodiment of the present invention discloses a gate driving method for a WBG semiconductor transistor. Receiving an on-off control signal. In response to a first status of the on-off control signal, delivering a first constant driving current to a gate terminal of the WBG semiconductor transistor to turn on the WBG semiconductor transistor. After a voltage of the gate terminal of the WBG semiconductor transistor is charged at a maximum value, automatically switching to deliver a second constant driving current to the gate terminal of the WBG semiconductor transistor to keep the WBG semiconductor activated, wherein the second constant driving current is lower than the first constant driving current. In response to a second status of the on-off control signal, pulling down the gate terminal of the WBG semiconductor transistor to turn off the WBG semiconductor transistor.

Yet another embodiment of the present invention discloses a current gate driver, comprising an input pin, a power supply pin, a first output pin, and a second output pin. The input pin is configured to receive an on-off control signal. The power supply pin configured to coupled to a power supply. The first output pin and the second output pin are coupled to a gate terminal of a WBG semiconductor transistor. In response to a first status of the on-off control signal, the gate driver is configured to provide a first constant driving current via the second output pin first, and later switch to a second constant driving current via the second output pin, to drive the gate terminal of the WBG semiconductor transistor. In response to a second status of the on-off control signal, the gate driver is configured to pull down the gate terminal of the WBG semiconductor transistor via the first output pin.

These and other features of the present invention will be readily apparent to persons of ordinary skill in the art upon reading the entirety of this disclosure, which includes the accompanying drawings and claims.

BRIEF DESCRIPTION OF DRAWINGS

The present invention can be further understood with reference to the following detailed description and the appended drawings, wherein like elements are provided with like reference numerals. The drawings are only for illustration purpose, thus may only show part of the devices and are not necessarily drawn to scale.

FIG. 7 illustrates a gate driving method 700 for a wide bandgap semiconductor transistor in accordance with an embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Reference to "one embodiment", "an embodiment", "an example" or "examples" means: certain features, structures, or characteristics are contained in at least one embodiment of the present invention. These "one embodiment", "an embodiment", "an example" and "examples" are not necessarily directed to the same embodiment or example. Furthermore, the features, structures, or characteristics may be combined in one or more embodiments or examples. In addition, it should be noted that the drawings are provided for illustration, and are not necessarily to scale. And when an element is described as "connected" or "coupled" to another element, it can be directly connected or coupled to the other element, or there could exist one or more intermediate elements. In contrast, when an element is referred to as "directly connected" or "directly coupled" to another element, there is no intermediate element. When a signal is described as "equal to" another signal, it is substantially identical to the other signal.

Figure 1:
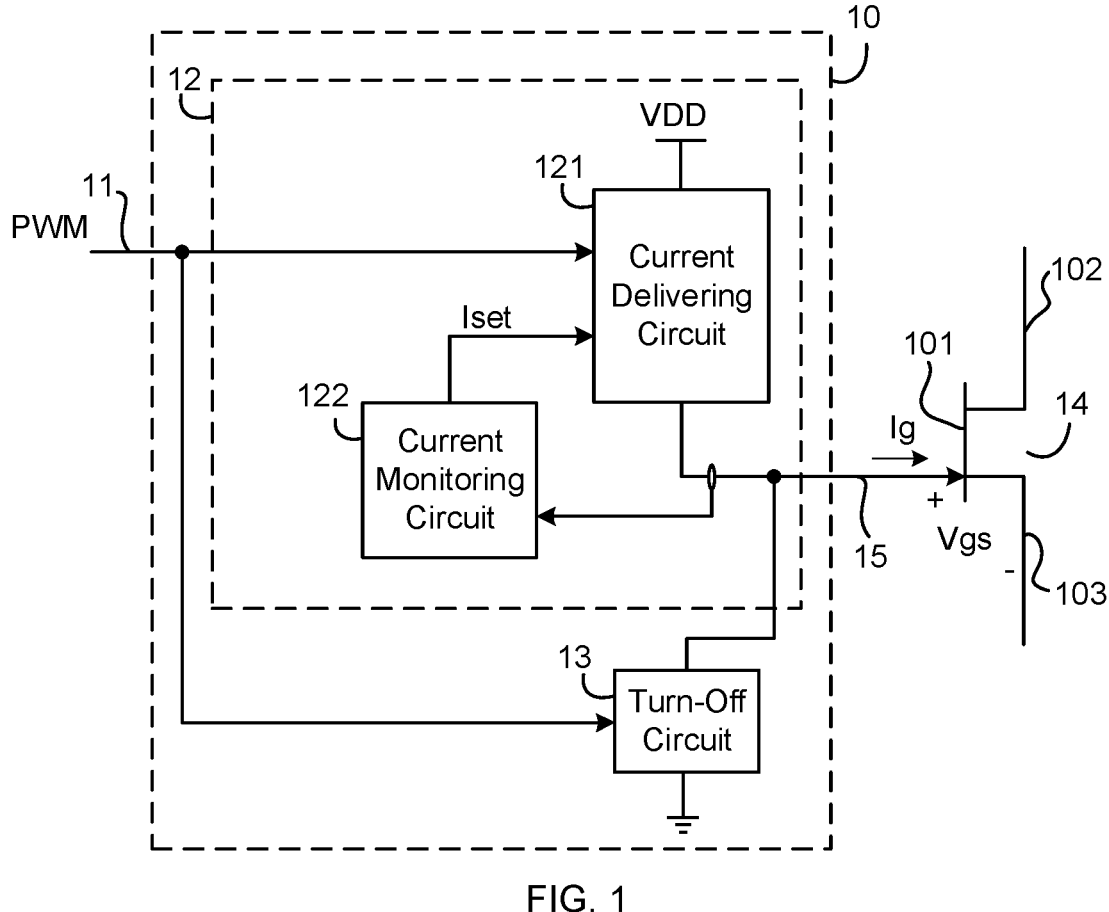
FIG. 1 illustrates a block diagram of a current gate driver 10 in accordance with an embodiment of the present invention.

FIG. 1 illustrates a block diagram of a current gate driver 10 in accordance with an embodiment of the present invention. The current gate driver 10 is configured to drive a wide bandgap (WBG) semiconductor transistor 14 by providing a gate current Ig flowing into a gate terminal 101 of the wide bandgap semiconductor transistor 14. The wide bandgap semiconductor transistor 14 has the gate terminal 101, a drain terminal 102, and a source terminal 103. As shown in FIG. 1, the current gate driver 10 has an input terminal 11, an output terminal 15, a turn-on circuit 12 and a turn-off circuit 13. The input terminal 11 is configured to receive an on-off control signal PWM. The current gate driver 10 is configured to turn on and turn off the wide bandgap semiconductor transistor 14 based on the on-off control signal PWM. For example, when the on-off control signal PWM is at a first status (e.g., logic high), the current gate driver 10 is configured to turn on the wide bandgap semiconductor transistor 14 via the turn-on circuit 12, such that the gate terminal 101 is pulled up, and a channel between the drain terminal 102 and the source terminal 102 of the wide bandgap semiconductor transistor 14 is formed. When the on-off control signal PWM is at a second status (e.g., logic low), the current gate driver 10 is configured to turn off the wide bandgap semiconductor transistor 14 via the turn-off circuit 13, such that the gate terminal 101 is pulled down, and the conduction path is off. In one embodiment, the turn-on circuit 12 is coupled to the gate terminal 101 of the wide bandgap semiconductor transistor 14 to pull up the gate terminal 101 in response to the first status of the on-off control signal PWM. The turn-off circuit 13 is coupled to the gate terminal 101 of the wide bandgap semiconductor transistor 14 to pull down the gate terminal 101 in response to the second status of the on-off control signal PWM. One with ordinary skill in the art should also understand that the wide bandgap semiconductor transistor 14 may comprise FET transistors of different wide bandgap semiconductors materials such as GaN and SiC.

The turn-on circuit 12 is to drive the gate terminal 101 of the wide bandgap semiconductor transistor 14 at a first constant driving current for quick turn-on of the wide bandgap semiconductor transistor 14, and later automatically switch to a second constant current to drive the gate terminal 101 of the wide bandgap semiconductor transistor 14. The second constant driving current is lower than the first constant current, such that the wide bandgap semiconductor transistor 14 is kept activated but with low gate power dissipation. In one embodiment, the first constant current and the second constant current is settable by user, through external components, such as resistors, to better fit gate requirements of each different kind of transistor. The switch between the first constant driving current and the second constant driving current will happen automatically without user's intervention. When driving a wide bandgap enhance mode high electron mobility transistors (HEMT) or gate injection transistors (GITs) with a conventional voltage driver, there is a tradeoff of using a driving resistor with a high resistance or a low resistance. Wherein the driving resistor is coupled to the gate terminal of the wide bandgap semiconductor transistor. When with the high resistance driving resistor, the turn-on and turn-off of the transistor is excessive slow, thus dissipating too much energy during the switching. While with the low resistance driving resistor, the gate current consumption will be highly relevant once the FET is on. Most of the times, there is no intermediate resistance for a fixed driving resistor satisfying both conditions.

In the example shown in FIG. 1, the turn-on circuit 12 comprises a current delivering circuit 121 and a current monitoring circuit 122. The current delivering circuit 121 is coupled to a power supply VDD, and is configured to provide the gate current Ig when the on-off control signal PWM indicates that the wide bandgap semiconductor transistor 14 should be turned on. The current monitoring circuit 122 monitors the gate current Ig, and provides a current set signal Iset accordingly. In one example, the current monitoring circuit 122 provides the current set signal Iset to indicate if the gate current Ig drops below the first constant driving current, e.g., below a current threshold.

The current delivering circuit 121 receives the on-off control signal PWM and the current set signal Iset, and provides the gate current Ig based on the on-off control signal PWM and the current set signal Iset. In one embodiment, when the on-off control signal PWM is activated to turn on the wide bandgap semiconductor transistor 14, the current delivering circuit 121 provides the first constant driving current first to drive the gate terminal 101, and then in response to the current set signal Iset, the current delivering circuit 121 switches to the second constant driving current to drive the gate terminal 101. Such that reduction of the gate current Ig and easily controllable voltage on the gate terminal 101 could be achieved.

Figure 2:
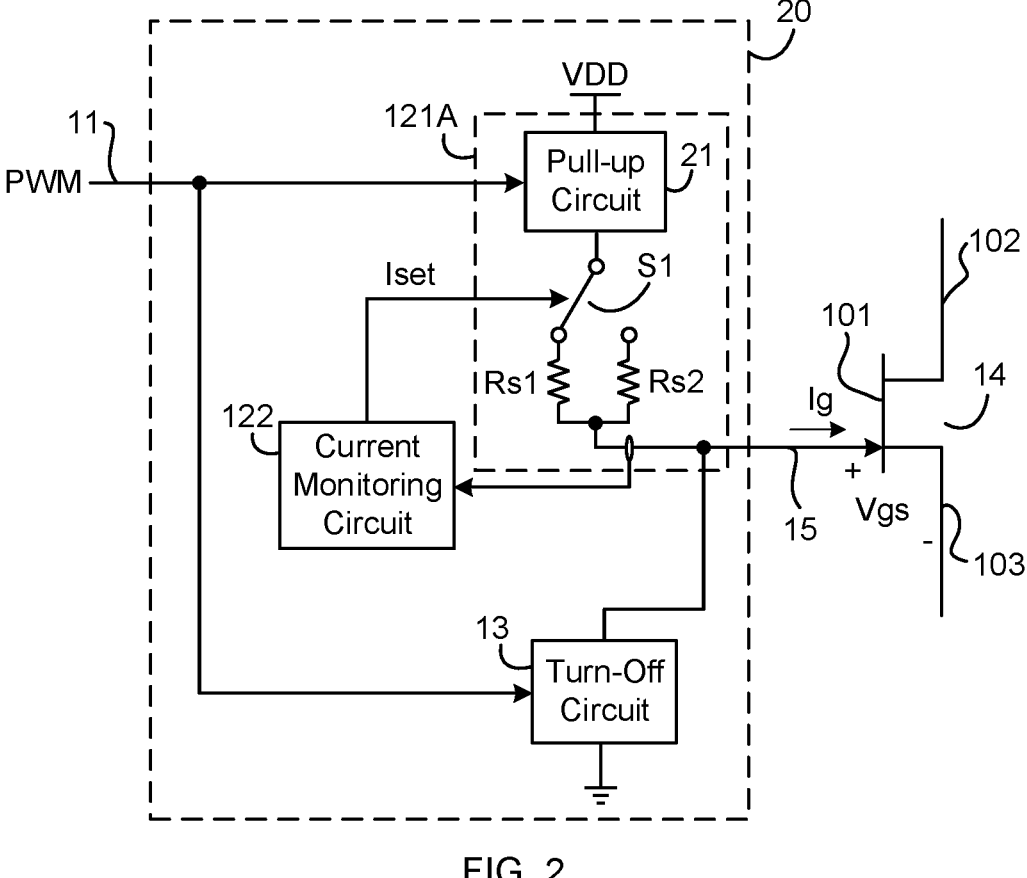
FIG. 2 illustrates a schematic diagram of a current gate driver 20 in accordance with an embodiment of the present invention.

FIG. 2 illustrates a schematic diagram of a current gate driver 20 in accordance with an embodiment of the present invention. As shown in FIG. 2, a current delivering circuit 121A of the current gate driver 20 employs resistors Rs1 and Rs2 to set the first constant driving current and the second constant driving current. In one embodiment, the resistor Rs1 is employed to set the first constant driving current, and the resistor Rs2 is employed to set the second constant driving current, which is lower than the first constant driving current.

The current delivering circuit 121A further comprises a pull-up circuit 21 and a switch S1. When the on-off control signal PWM is activated to turn on the wide bandgap semiconductor transistor 14, the gate terminal 101 is pulled up by the pull-up circuit 21 through the resistor Rs1 first to establish the first constant driving current, and the gate terminal 101 is pulled up by the pull-up circuit 21 through the resistor Rs2 to establish the second constant driving current if the gate current Ig drops below the first constant current. In one embodiment, the pull-up circuit 21 is coupled between the power supply VDD and resistors Rs1-Rs2. The switch S1 behaves as a single-pole double-throw switch, such that under the control of the current set signal Iset, the switch S1 is configured to connect one of the resistors Rs1 and Rs2 to the pull-up circuit 21. One with ordinary skill in the art should understand that the position of the pull-up circuit 21, the switch S1 and the resistors Rs1 and Rs2 are not limited by FIG. 2. For example, the resistors Rs1 and Rs2 may be coupled to the pull-up circuit 21 directly and the switch S1 may be coupled between the gate terminal 101 and the resistors Rs1-Rs2, without detracting from merits of the present invention.

Figure 3:
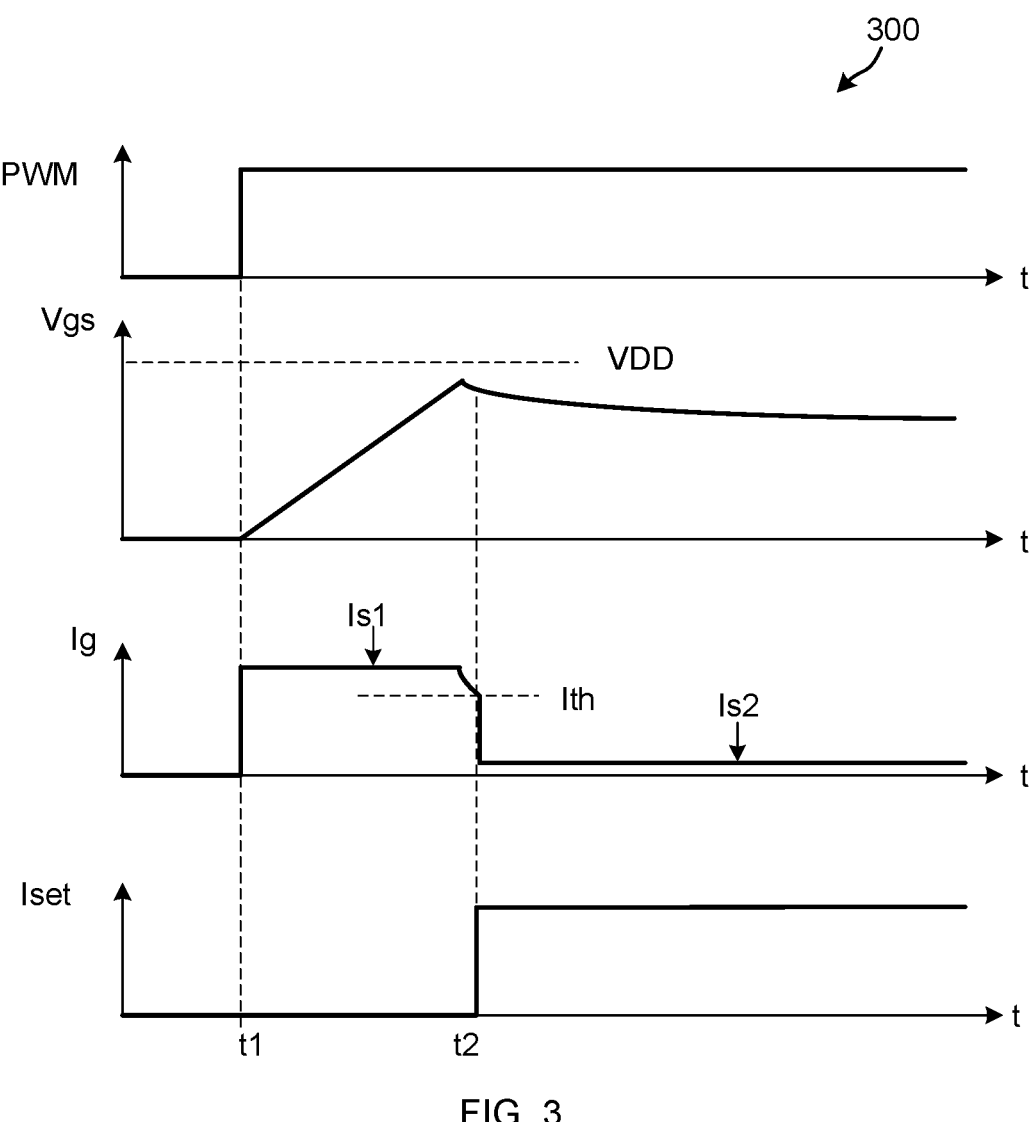
FIG. 3 illustrates a timing diagram 300 for driving the wide bandgap semiconductor transistor 14 in accordance with an embodiment of the present invention.

FIG. 3 illustrates a timing diagram 300 for driving the wide bandgap semiconductor transistor 14 in accordance with an embodiment of the present invention. From top to below, FIG. 3 shows the on-off control signal PWM, a gate voltage Vgs, the gate current Ig, and the current set signal Iset. The gate voltage Vgs is a voltage across the gate terminal 101 and the source terminal 103 of the wide bandgap semiconductor transistor 14.

At time t1, the on-off control signal PWM1 transits to logic high to indicate that the wide bandgap semiconductor transistor 14 should be turned on. The current gate driver 20 shown in FIG. 2 is configured to turn on the wide bandgap semiconductor transistor 14 by pulling up the gate terminal 101 first through the resistor Rs1, and the gate current Ig is set equal to a constant driving current Is1. The gate voltage Vgs increases with a settable slew rate. When the gate terminal 101 is fully charged, e.g., the gate voltage Vgs is charged to a maximum value, e.g, the power supply VDD minus a voltage drop across the current delivering circuit 121A, the current delivering circuit 121A is unable to inject current to the gate terminal 101 at the same value, such that the gate current Ig drops from the constant driving current Is1. Until the gate current Ig drops below a threshold Ith at time t2, the current set signal Iset becomes logic high, the current gate driver 20 is configured to pull up the gate terminal 101 through the resistor Rs2, and the gate current Ig is set equal to a constant driving current Is2, which is less than the constant driving current Is1 significantly. The constant driving current Is1 is determined by the resistor Rs1, and the constant driving current Is2 is determined by the resistor Rs2.

Figure 4:
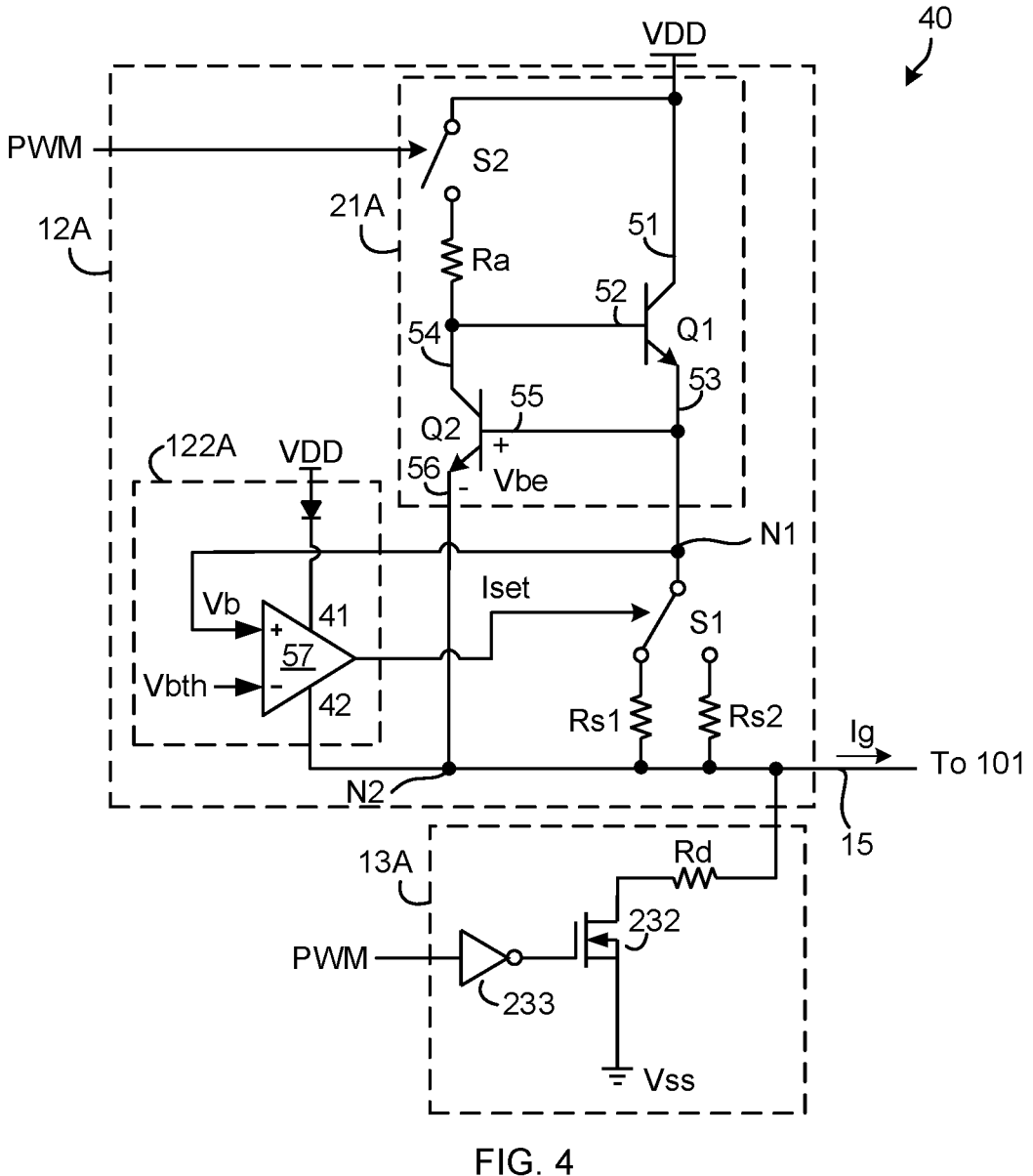
FIG. 4 illustrates a schematic diagram of a current gate driver 40 in accordance with an embodiment of the present invention.

FIG. 4 illustrates a schematic diagram of a current gate driver 40 in accordance with an embodiment of the present invention. The current gate driver 40 receives the on-off control signal PWM, and provides the gate current Ig to the gate terminal 101 of the wide bandgap semiconductor transistor 14. When the on-off control signal PWM indicates that the wide bandgap semiconductor transistor 14 should be turned on, a turn-on circuit 12A formed by a pullup circuit 21A, a current monitoring circuit 122A, and the resistors Rs1-Rs2 is configured to delivering the gate current Ig to the gate terminal 101 of the wide bandgap semiconductor transistor 14. When the on-off control signal PWM indicates that the wide bandgap semiconductor transistor 14 should be turned off, a turn-off circuit 13A is configured to draw the gate current Ig from the gate terminal 101 of the wide bandgap semiconductor transistor 14.

In the embodiment shown in FIG. 4, the pull up circuit 21A comprises a transistor Q1, a transistor Q2, and a switch S2. In one embodiment, the transistor Q1 and the transistor Q2 are Bipolar Junction Transistor (BJT). A terminal 51 of the transistor Q1 is coupled to the power supply VDD, a terminal 53 of the transistor Q1 is coupled to a node N1, thus to be coupled to one of the resistors Rs1 and Rs2 through the switch S1, and a control terminal 52 is coupled to a terminal 54 of the transistor Q2. The terminal 54 of the transistor Q2 is coupled to the power supply VDD through a resistor Ra and the switch S2. The set of the transistors Q1-Q2, the resistors Ra, and RS1 are intended to behave as a constant current source supply, and the set of the transistors Q1-Q2, the resistors Ra, and RS2 are intended to behave as another constant current source supply. In response to the on-off control signal PWM to turn on the wide bandgap semiconductor transistor 14, the switch S2 is turned on to connect the terminal 54 of the transistor Q2 to the power supply VDD through the resistor Ra, such that the gate terminal 101 of the wide bandgap semiconductor transistor 14 could be pulled up via the pull up circuit 21A and one of the resistors Rs1 and Rs2. A control terminal 55 of the transistor Q2 is coupled to the terminal 53 of the transistor Q1, and a terminal 56 of the transistor Q2 is coupled to the resistors Rs1 and Rs2 at a node N2, which is coupled to the output terminal 15 of the current gate driver 40. The resistors Rs1 and Rs2 are coupled between the node N2 and the node N1. In response to the on-off control signal PWM to turn off the wide bandgap semiconductor transistor 14, the switch S2 is turned off to disconnect the terminal 54 of the transistor Q2 from the power supply VDD, such that a pull up path of the gate terminal 101 of the wide bandgap semiconductor transistor 14 via the pull-up circuit 21A is disconnected. In one embodiment, the terminal 51 and the terminal 54 are Collector, the terminal 52 and the terminal 55 are Base, and the terminal 53 and the terminal 56 are Emitter of the transistors Q1-Q2 respectively.

In the embodiment shown in FIG. 4, the current monitoring circuit 122A comprises a comparison circuit 57. The comparison circuit 57 is coupled to the node N1 to receive a voltage Vb at the terminal 55 of the transistor Q2 as a current sensing signal, to reflect dropping of the gate current Ig. The comparison circuit 57 is configured to provide the current set signal Iset via comparing the voltage Vb with a threshold Vbth, in other words comparing the current sensing signal with a threshold. In one embodiment, the comparison circuit 57 is a comparator. The comparison circuit 57 has a power supply terminal 41 coupled to the power supply VDD and a reference terminal 42 coupled to the node N2, such that the voltage reference for the comparison circuit 57 and the two inputs of the comparison circuit 57 is the node N2. Such that the comparison circuit 57 is configured to provide the current sent signal Iset via comparing a voltage Vbe across the terminal 55 and the terminal 56 with the threshold Vbth. The terminal 55 and the terminal 53 are selectively coupled to one of the resistor Rs1 and the resistor Rs2 based on a comparison result between the threshold Vbth and the voltage Vbe. In one embodiment, one terminal of the switch S1 is coupled to the node N1, and under the control of the current set signal Iset, the other terminal of the switch S1 is selectively coupled to one of the resistor Rs1 and the resistor Rs2, to set the gate current Ig. By default, the turn-on circuit 12A is configured to limit the gate current Ig through the transistors Q1-Q2, the resistors Ra and Rs1, such that the gate terminal 101 of the wide bandgap semiconductor transistor 14 is charged at a first constant rate. In this status, the voltage Vbe is a value under the condition that the transistor Q2 full conducts current, e.g., the voltage Vbe is in the range of 0.5-0.7V. When the gate terminal 101 of the wide bandgap semiconductor transistor 14 is fully charged, the gate current Ig drops, so does the voltage Vb. The comparison circuit 57 could notice dropping of the gate current Ig via monitoring the voltage Vb, e.g., when the voltage Vbe is reduced to the threshold Vbth, and then the turn-on circuit 12A could switch to provide the lower gate current Ig, through the transistors Q1-Q2, the resistors Ra and Rs2. In one embodiment, the threshold Vbth is 0.4V, less than the voltage Vbe of the full conducted transistor Q2.

The turn-off circuit 13A comprises a pull down resistor Rd and a pull down FET 232. The pull down resistor Rd and the pull down FET 232 are coupled in series between the gate terminal 101 and a reference ground Vss. In one embodiment, the reference ground Vss is coupled to the source terminal 103 of the wide bandgap semiconductor transistor 14. In one embodiment, when the on-off control signal PWM indicates that the wide bandgap semiconductor transistor 14 should be turned off, the pull down FET 232 is turned on via a driver 233, to pull down the gate terminal 101 of the wide bandgap semiconductor transistor 14 via the pull down resistor Rd. In one embodiment, the pull down resistor Rd may be a turn on resistor of the pull down FET 232.

Figure 5:
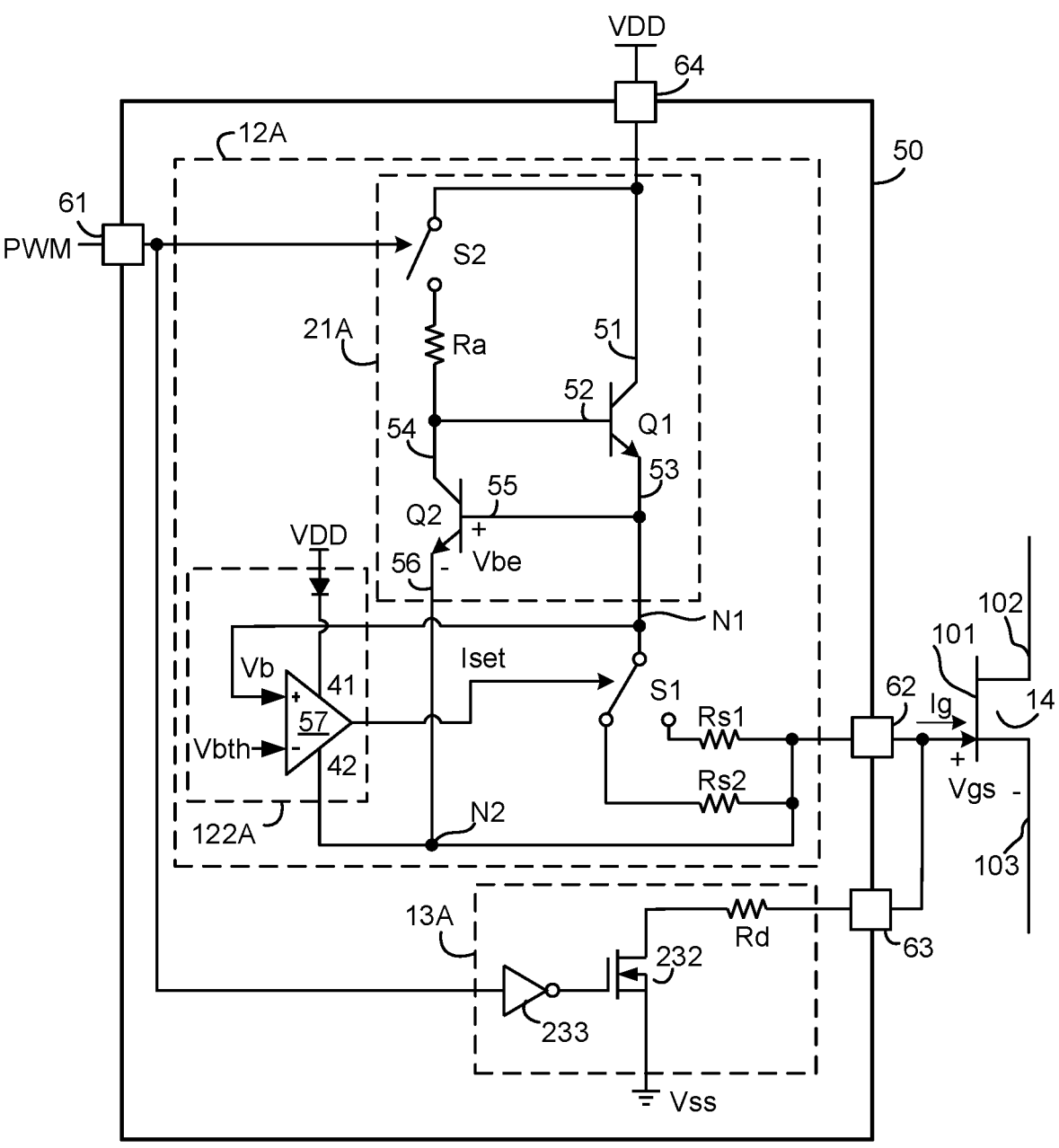
FIG. 5 illustrates a current gate driver 50 in accordance with an embodiment of the present invention.

FIG. 5 illustrates a current gate driver 50 in accordance with an embodiment of the present invention. As shown in FIG. 5, the current gate driver 50 is integrated on an integrated circuit (IC), and the current gate driver 50 has an input pin 61, output pins 62-63, a power supply pin 64. The input pin 61 is configured to receive the on-off control signal PWM, the output pins 62-63 are coupled to the gate terminal 101 of the wide bandgap semiconductor transistor 14, the power supply pin 64 is coupled to the power supply VDD. As shown in FIG. 5, the turn-on circuit 12A is coupled to the output pin 62 to pull up the gate terminal 101, and the turn-off circuit 13A is coupled to the output pin 63 to pull down the gate terminal 101. In one embodiment, in response to the first status of the on-off control signal PWM, the current gate driver 50 is configured to provide the first constant driving current via the output pin 62 first, and later switch to the second constant driving current via the output pin 62, to drive the gate terminal 101 of the wide bandgap semiconductor transistor 14. In response to the second status of the on-off control signal PWM, the gate driver 50 is configured to pull down the gate terminal 101 of the wide bandgap semiconductor transistor 14 via the output pin 63.

In one embodiment, the output pin 52 is coupled to the resistor Rs1 and the resistor Rs2.

Figure 6:
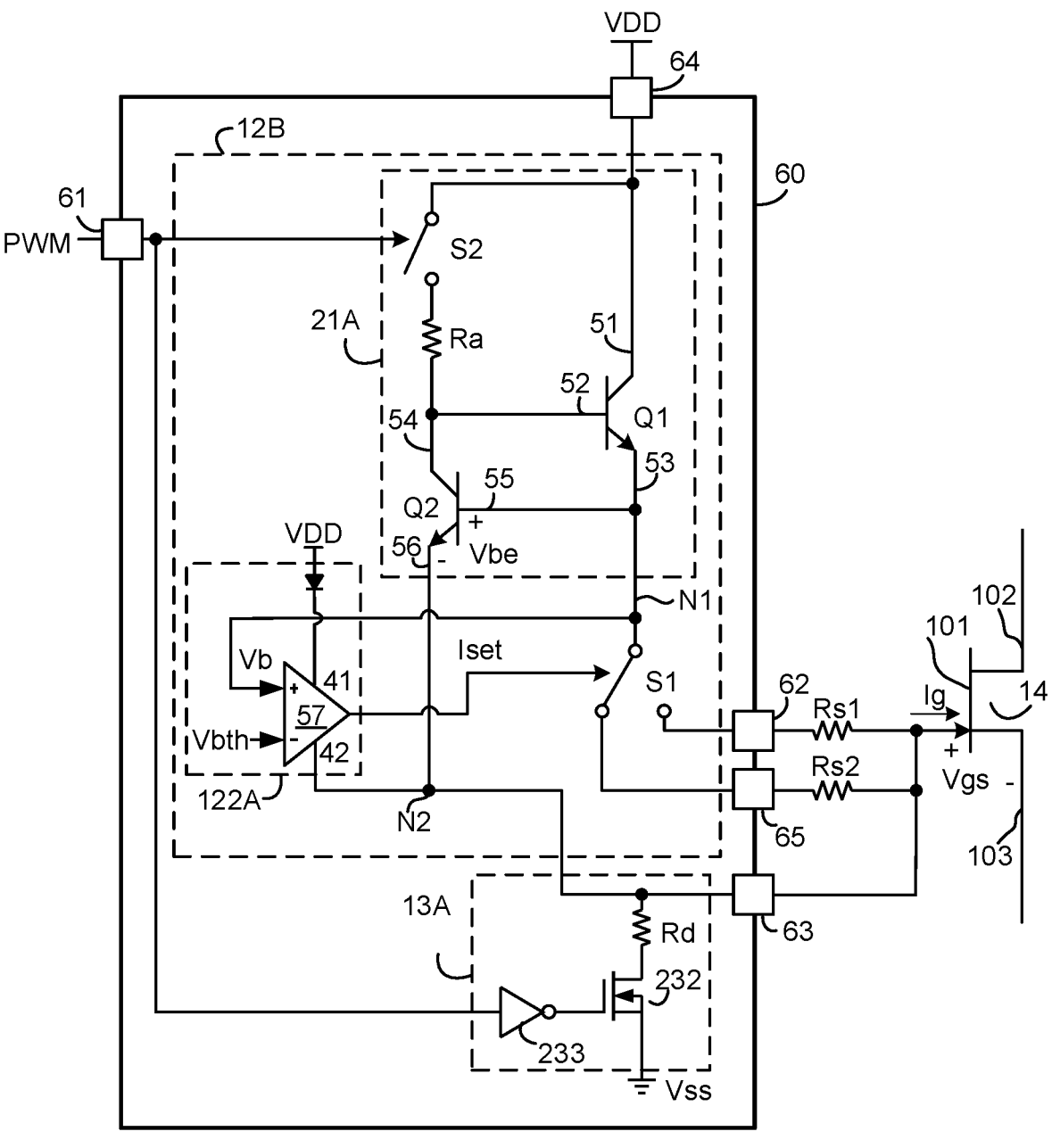
FIG. 6 illustrates a current gate driver 60 in accordance with an embodiment of the present invention.

FIG. 6 illustrates a current gate driver 60 in accordance with an embodiment of the present invention. As shown in FIG. 6, the current gate driver 60 is integrated on another IC, and the current gate driver 60 has the input pin 61, the output pin 62, the output pin 63, an output pin 65, and the power supply pin 64. The output pin 62 is coupled to the gate terminal 101 through the resistor Rs1 to establish the first constant driving current, and the output pin 65 is coupled to the gate terminal 101 through the resistor Rs2 to establish the second constant driving current. As shown in FIG. 6, a turn-on circuit 12B is coupled to the output pin 62 and the output pin 65 to pull up the gate terminal 101. The external resistors Rs1 and Rs2 are employed to better fit gate requirement of different kind of the transistor 14.

FIG. 7 illustrates a gate driving method 700 for a wide bandgap semiconductor transistor in accordance with an embodiment of the present invention. The method 700 has steps S11-S14.

At the step S11, receiving an on-off control signal.

At the step S12, in response to a first status (e.g., logic high) of the on-off control signal, delivering a first constant driving current to the gate terminal of the wide bandgap semiconductor transistor to quick turn on the wide bandgap semiconductor transistor.

At the step S13, after the gate of the wide bandgap semiconductor transistor is fully charged at a maximum voltage, automatically switching to deliver a second constant driving current to the gate terminal of the wide bandgap semiconductor transistor to keep the wide bandgap semiconductor transistor activated but with low gate power dissipation. The second constant driving current is lower than the first constant driving current. In one embodiment, the first constant driving current is established via a first resistor, and the second constant driving current is established via a second resistor.

At the step S14, in response to a second status (e.g., logic low) of the on-off control signal, pulling down the gate terminal of the wide bandgap semiconductor transistor to turn off the wide bandgap semiconductor transistor.

In one embodiment, the control method 700 further comprises establishing the first constant driving current via the first resistor, and when a current flowing through the gate terminal of the wide bandgap semiconductor transistor drops below a threshold, establishing the second constant driving current via the second resistor.

Note that in the control method 700 described above, the box functions may also be implemented with different order as shown in FIG. 7. Two successive box functions may be executed meanwhile, or sometimes the box functions may be executed in a reverse order.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

I claim:

1. A current gate driver for a wide bandgap (WBG) semiconductor transistor, comprising:

an input terminal configured to receive an on-off control signal;

an output terminal coupled to a gate terminal of the WBG semiconductor transistor;

a turn-on circuit coupled to the output terminal, to drive the WBG semiconductor transistor by providing a gate current flowing into the gate terminal of the WBG semiconductor transistor via the output terminal in response to a first status of the on-off control signal; and a turn-off circuit coupled to the output terminal, to pull down the gate terminal of the WBG semiconductor transistor and turn off the WBG semiconductor transistor in response to a second status of the on-off control signal; wherein when the on-off control signal transits to the first status, the turn-on circuit is configured to drive the gate terminal of the WBG semiconductor transistor at a first constant driving current first, and later after a gate voltage of the WBG semiconductor transistor is charged to a maximum value, in response to the gate current dropping below a first threshold, the turn-on circuit switches and is configured to provide a second constant driving current to drive the gate terminal of the WBG semiconductor transistor, and the second constant driving current is lower than the first constant driving current.

2. The current gate driver of claim 1, wherein the turn-on circuit is configured to set the first constant driving current via a first resistor and configured to set the second constant driving current via a second resistor.

3. The current gate driver of claim 1, wherein the turn-on circuit further comprises:

a current monitoring circuit, configured to monitor the gate current, and provide a current set signal accordingly; and a current delivering circuit coupled to a power supply, the current delivering circuit is configured to pull up the gate terminal of the WBG semiconductor transistor with one of the first constant driving current and the second constant driving current based on the current set signal and the on-off control signal.

4. The current gate driver of claim 3, wherein when the on-off control signal transits to the first status, the current delivering circuit is configured to provide the first constant driving current to drive the gate terminal of the WBG semiconductor transistor, and then in response to the current set signal, the current delivering circuit is configured to provide the second constant driving current to drive the gate terminal of the WBG semiconductor transistor.

5. The current gate driver of claim 3, wherein the current monitoring circuit further comprises:

a comparison circuit, configured to receive a current sensing signal, and configured to provide the current set signal via comparing the current sensing signal with a second threshold, wherein the current sensing signal is capable of reflecting dropping of the gate current.

6. The current gate driver of claim 1, wherein the turn-on circuit further comprises:

a first transistor having a collector coupled to a power supply, an emitter coupled to a first node, and a base coupled to the power supply through a switch, wherein the switch is turned on and off based on the on-off control signal; and a second transistor having a collector coupled to the base of the first transistor, an emitter coupled to a second node, and a base coupled to the emitter of the first transistor at the first node; wherein a first resistor and a second resistor are coupled between the first node and the second node, and the second node is coupled to the output terminal of the gate driver.

7. The current gate driver of claim 6, wherein the turn-on circuit further comprises:

a comparison circuit, configured to compare a voltage across the base and the emitter of the second transistor with a third threshold, and the emitter of the first transistor and the base of the second transistor are configured to be selectively coupled to one of the first resistor and the second resistor based on a comparison result between the third threshold and the voltage across the base and the emitter of the second transistor.

8. A gate driving method for a wide bandgap (WBG) semiconductor transistor, comprising:

providing an output terminal coupled to a gate terminal of the WBG semiconductor transistor;

using an input terminal for receiving an on-off control signal;

using a turn-on circuit coupled to the output terminal for driving the WBG semiconductor transistor by providing a gate current flowing into the gate terminal of the WBG semiconductor transistor via the output terminal in response to a first status of the on-off control signal;

using a turn-off circuit coupled to the output terminal for pulling down the gate terminal of the WBG semiconductor transistor and turning off the WBG semiconductor transistor in response to a second status of the on-off control signal;

in response to a transition to the first status of the on-off control signal, causing the turn-on circuit to first drive a first constant driving current to the gate terminal of the WBG semiconductor transistor to turn on the WBG semiconductor transistor;

later after a voltage of the gate terminal of the WBG semiconductor transistor is charged to a maximum value, in response to the gate current dropping below a first threshold, causing the turn-on circuit to automatically switch and be configured to provide and deliver a second constant driving current to the gate terminal of the WBG semiconductor transistor to keep the WBG semiconductor activated, wherein the second constant driving current is lower than the first constant driving current; and in response to the second status of the on-off control signal, pulling down the gate terminal of the WBG semiconductor transistor to turn off the WBG semiconductor transistor.

9. The gate driving method of claim 8, wherein the first constant driving current is established via a first resistor, and the second constant driving current is established via a second resistor.

10. The gate driving method of claim 8, further comprising:

coupling a collector of a first transistor of the turn-on circuit to a power supply, and coupling a base of the first transistor of the turn-on circuit to the power supply through a switch;

coupling a collector of a second transistor of the turn-on circuit to the base of the first transistor, coupling a base of the second transistor of the turn-on circuit to an emitter of the first transistor, and coupling an emitter of the second transistor of the turn-on circuit to the gate terminal of the WBG semiconductor transistor; and turning on and off the switch based on the on-off control signal.

11. The gate driving method of claim 10, further comprising:

comparing a voltage across the base and the emitter of the second transistor of the turn-on circuit with a second threshold; and selectively coupling the emitter of the first transistor and the base of the second transistor of the turn-on circuit to one of a first resistor and a second resistor based on a comparison result between the second threshold and the voltage across the base and the emitter of the second transistor.

12. A current gate driver, comprising:

an input pin configured to receive an on-off control signal;

a power supply pin configured to be coupled to a power supply; and a first output pin and a second output pin coupled to a gate terminal of a wide bandgap (WBG) semiconductor transistor; a turn-on circuit coupled to the second output pin, configured to drive the WBG semiconductor transistor by providing a gate current flowing into the gate terminal of the WBG semiconductor transistor via the second output pin in response to a first status of the on-off control signal; and a turn-off circuit coupled to the first output pin, configured to pull down the gate terminal of the WBG semiconductor transistor and turn off the WBG semiconductor transistor in response to a second status of the on-off control signal; wherein in response to a transition to the first status of the on-off control signal, the turn-on circuit of the gate driver is configured to first provide to the gate terminal of the WPG semiconductor transistor a first constant driving current via the second output pin first, and later after a gate voltage of the WBG semiconductor transistor is charged to a maximum value, in response to the gate current dropping below a first threshold, the turn-on circuit of the gate drive switches and is configured to provide a second constant driving current, lower than the first constant driving current, via the second output pin, to drive the gate terminal of the WBG semiconductor transistor; and wherein in response to the second status of the on-off control signal, the turn-off circuit of the gate driver is configured to pull down the gate terminal of the WBG semiconductor transistor via the first output pin.

13. The current gate driver of claim 12, further comprising:

a third output pin coupled to the gate terminal of the WBG semiconductor transistor; wherein the second output pin is capable of being coupled to a first resistor to establish the first constant driving current; and wherein the third output pin is capable of being coupled to a second resistor to establish the second constant driving current.

14. The current gate driver of claim 12, wherein the second output pin is configured to be coupled to a first resistor and a second resistor, wherein the first resistor is used to establish the first constant driving current, and the second resistor is used to establish the second constant driving current.

15. The current gate driver of claim 12, wherein the second constant driving current is lower than the first constant driving current.

16. The current gate driver of claim 12, further comprising:

a first transistor of the turn-on circuit having a collector coupled to the power supply, an emitter coupled to a first node, and a base coupled to the power supply through a switch, wherein the switch is turned on and off based on the on-off control signal; and a second transistor of the turn-on circuit having a collector coupled to the base of the first transistor, an emitter coupled to a second node, and a base coupled to the emitter of the first transistor at the first node; wherein a first resistor and a second resistor are coupled between the first node and the second node, and the second node is coupled to the output terminal of the gate driver.

17. The current gate driver of claim 16, further comprising:

a comparison circuit, configured to compare a voltage across the base and the emitter of the second transistor of the turn-on circuit with a second threshold, and the emitter of the first transistor of the turn-on circuit and the base of the second transistor of the turn-on circuit are configured to be selectively coupled to one of the first resistor and the second resistor based on a comparison result between the threshold and the voltage across the base and the emitter of the second transistor.

18. The current gate driver of claim 17, wherein the second threshold is lower than the voltage across the base and the emitter of the second transistor of the turn-on circuit in full conduction.

19. The current gate driver of claim 11, wherein the second threshold is lower than the voltage across the base and the emitter of the second transistor of the turn-on circuit in full conduction.

20. The current gate driver of claim 3, wherein the current delivering circuit further comprises:

a pull-up circuit; and a single-pole double-throw switch capable of coupling the pull-up circuit to the output terminal of the current gate driver via either a first resistor or a second resistor, wherein when the on-off control signal transits to the first status and in response to the current set signal, the turn-on circuit is configured to set the first constant driving current via the first resistor and configured to set the second constant driving current via the second resistor.

* * * * *